US008637356B2

(12) United States Patent
Somu et al.

(10) Patent No.: US 8,637,356 B2
(45) Date of Patent: Jan. 28, 2014

(54) METHOD OF INTEGRATING A SINGLE NANOWIRE INTO A NANOCIRCUIT

(75) Inventors: Sivasubramanian Somu, Boston, MA (US); Ahmed Busnaina, Ashland, MA (US); Nicol McGruer, Dover, MA (US); Peter Ryan, Waltham, MA (US); George G. Adams, West Newton, MA (US); Xugang Xiong, Boston, MA (US); Taehoon Kim, Boston, MA (US)

(73) Assignee: Northeastern University, Boston, MA (US)

( * ) Notice: Subject to any disclaimer, the term of this patent is extended or adjusted under 35 U.S.C. 154(b) by 0 days.

(21) Appl. No.: 13/534,105

(22) Filed: Jun. 27, 2012

(65) Prior Publication Data
US 2012/0267223 A1    Oct. 25, 2012

Related U.S. Application Data

(62) Division of application No. 13/228,701, filed on Sep. 9, 2011, now Pat. No. 8,211,765, which is a division of application No. 12/594,954, filed as application No. PCT/US2008/004584 on Apr. 9, 2008, now Pat. No. 8,031,514.

(60) Provisional application No. 60/922,468, filed on Apr. 9, 2007.

(51) Int. Cl.
*B82Y 10/00*     (2011.01)
*H01L 21/00*     (2006.01)

(52) U.S. Cl.
USPC .............. 438/151; 438/152; 257/E51.04

(58) Field of Classification Search
USPC ............ 438/151–170; 977/940; 257/E21.054
See application file for complete search history.

(56) References Cited

U.S. PATENT DOCUMENTS

| 4,979,149 | A  |          | 12/1990 | Popovic et al. |
|-----------|----|----------|---------|----------------|
| 5,677,823 | A  |          | 10/1997 | Smith          |
| 5,721,721 | A  |          | 2/1998  | Yanagisawa et al. |
| 6,835,613 | B2 |          | 12/2004 | Schlaf         |
| 6,919,592 | B2 |          | 7/2005  | Segal et al.   |
| 7,091,096 | B2 | *        | 8/2006  | Balasubramanian et al. ... 438/292 |
| 7,129,513 | B2 | *        | 10/2006 | Zhou et al. ................. 257/10 |
| 7,279,760 | B2 | *        | 10/2007 | Viefers et al. ............. 257/415 |
| 7,288,970 | B2 | *        | 10/2007 | Bertin ....................... 326/120 |
| 7,541,842 | B2 | *        | 6/2009  | Bertin et al. ................ 326/104 |

(Continued)

FOREIGN PATENT DOCUMENTS

WO     WO 01/03208    1/2001

OTHER PUBLICATIONS

Nanomanufacturing Summit 2009, Boston, MA, May 27-29, Poster Abstract, copies distributed at meeting, 3 pages.

(Continued)

*Primary Examiner* — Mohsen Ahmadi
*Assistant Examiner* — Evren Seven
(74) *Attorney, Agent, or Firm* — McLane, Graf, Raulerson & Middleton, PA

(57) ABSTRACT

A non-volatile bistable nano-electromechanical switch is provided for use in memory devices and microprocessors. The switch employs carbon nanotubes as the actuation element. A method has been developed for fabricating nanoswitches having one single-walled carbon nanotube as the actuator. The actuation of two different states can be achieved using the same low voltage for each state.

15 Claims, 14 Drawing Sheets

(56) References Cited

U.S. PATENT DOCUMENTS

| | | | |
|---|---|---|---|
| 7,736,979 B2 * | 6/2010 | Farrow et al. | 438/270 |
| 7,885,103 B2 | 2/2011 | Trossen et al. | |
| 7,927,978 B2 * | 4/2011 | Pfeiffer | 438/478 |
| 7,964,143 B2 * | 6/2011 | Farrow et al. | 422/68.1 |
| 8,063,455 B2 * | 11/2011 | Kordus et al. | 257/415 |
| 8,257,566 B2 * | 9/2012 | Farrow et al. | 204/450 |
| 2002/0174288 A1 * | 11/2002 | Lincoln | 711/103 |
| 2004/0023514 A1 * | 2/2004 | Moriya et al. | 438/778 |
| 2004/0085805 A1 | 5/2004 | Segal et al. | |
| 2005/0175981 A1 | 8/2005 | Voldman et al. | |
| 2006/0242741 A1 * | 10/2006 | Krupke et al. | 977/845 |

OTHER PUBLICATIONS

MicroManufacturing & NanoManufacturing Conference 2008, Apr. 22, Poster Session, www.sme.org/cgi-bin/get-evdoc.pl?&&001750&000007&poster&&SME&, 2 pages.

* cited by examiner

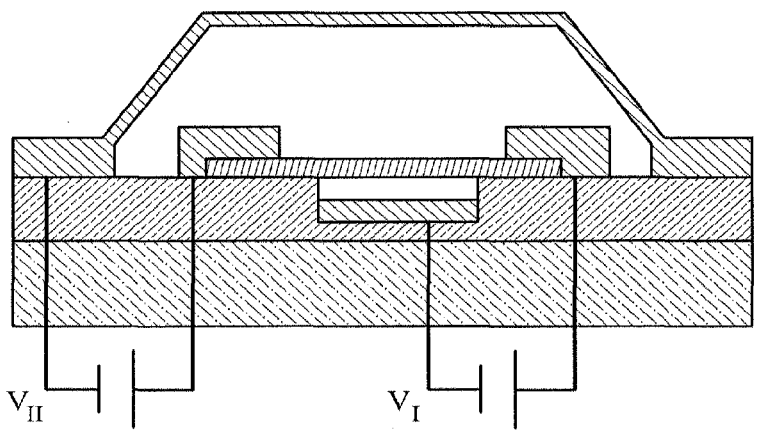
FIG. 1A
PRIOR ART
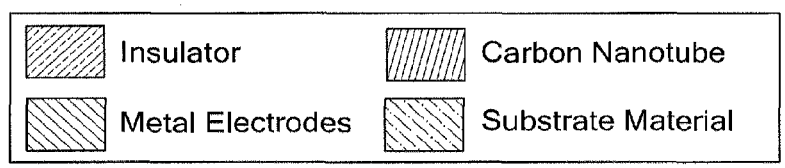
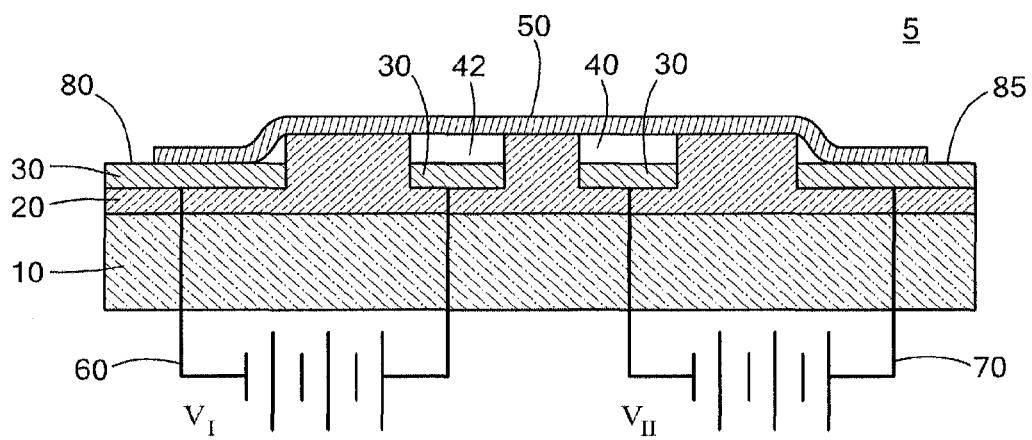
$V_{II} = V_I$ FIG. 1B
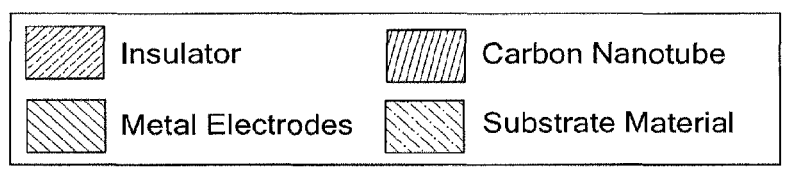

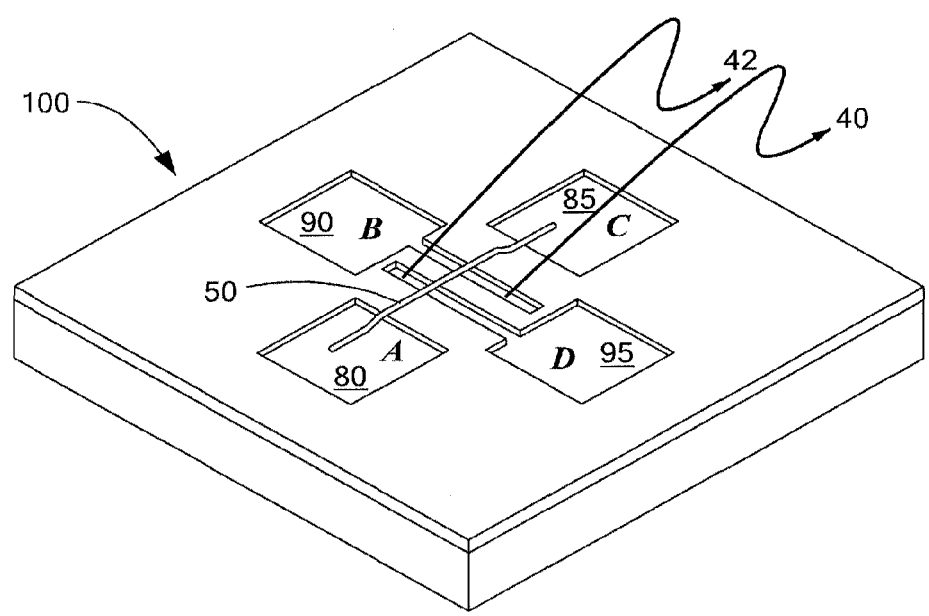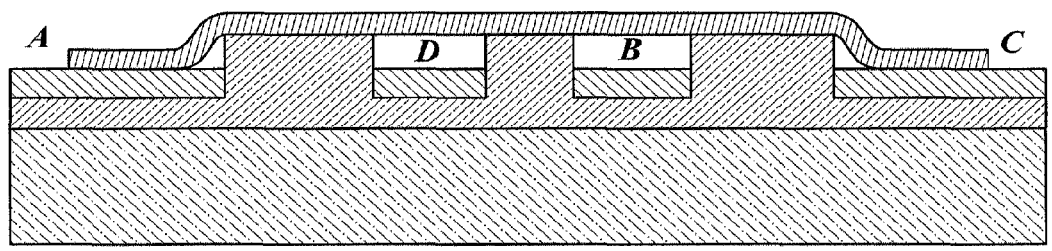
*FIG. 2*

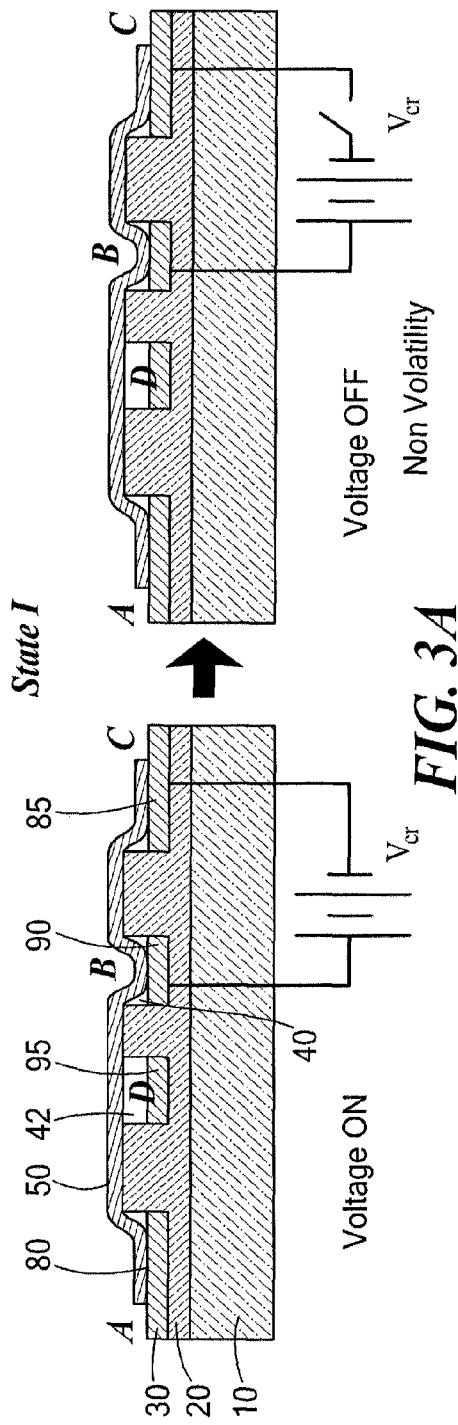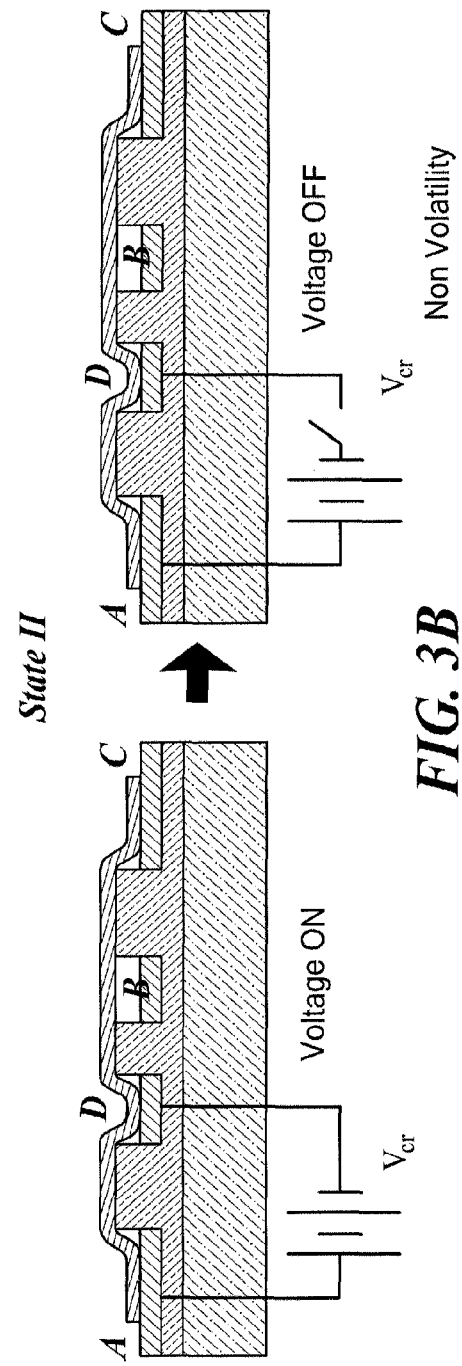
FIG. 3A
FIG. 3B

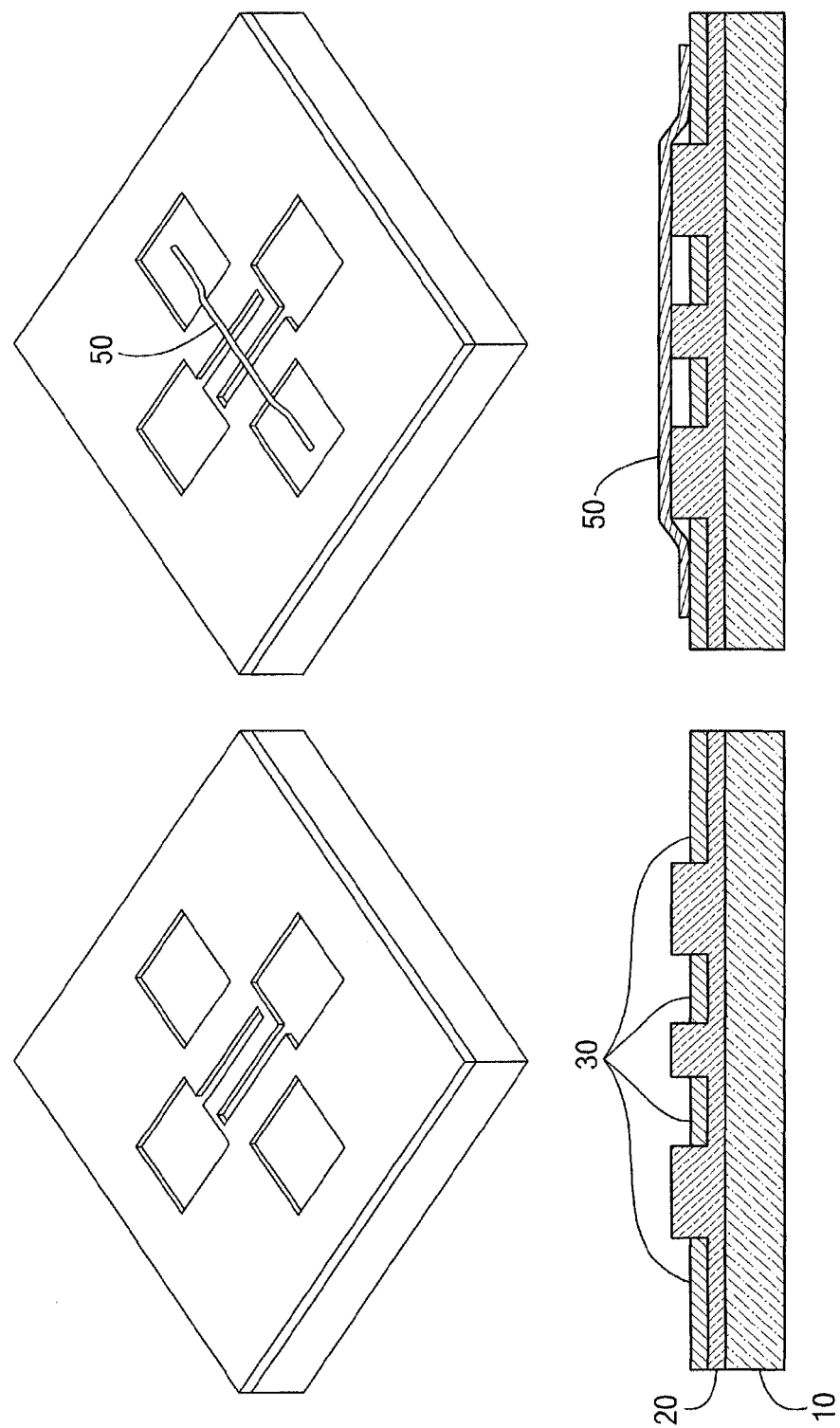

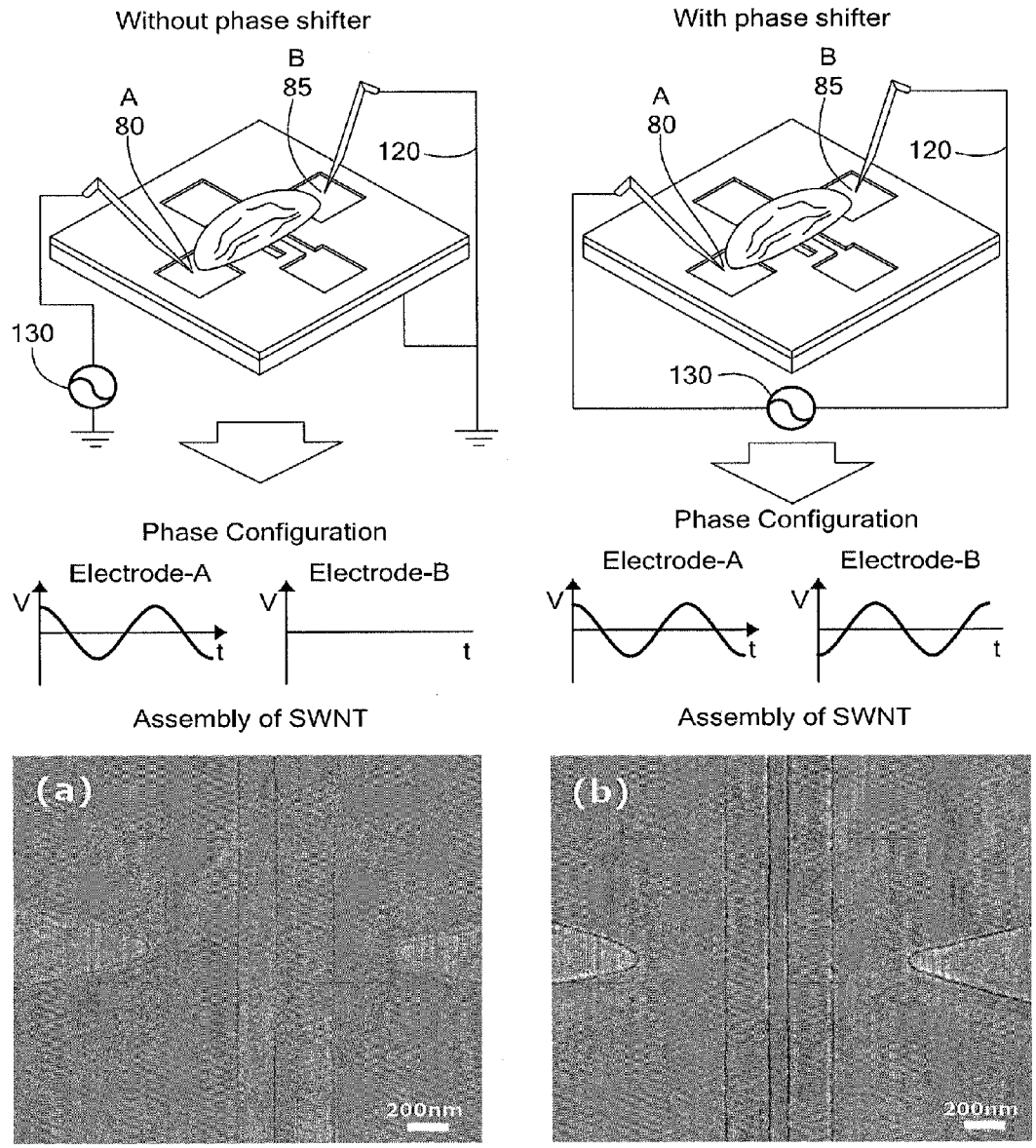
*FIG. 8A*  *FIG. 8B*

METHOD OF INTEGRATING A SINGLE NANOWIRE INTO A NANOCIRCUIT

CROSS REFERENCE TO RELATED APPLICATIONS

This application is a divisional of U.S. application Ser. No. 13/228,701, filed on Sep. 9, 2011 entitled, BISTABLE NANOSWITCH which is a divisional of U.S. application Ser. No. 12/594,954, now U.S. Pat. No. 8,031,514 issued on Oct. 4, 2011 entitled, BISTABLE NANOSWITCH which is a 371 of International Application No. PCT/US2008/004584, filed on Apr. 9, 2008 and claims the priority of U.S. Provisional Application No. 60/922,468 filed on Apr. 9, 2007 and entitled BISTABLE NANOSWITCH. All of the aforementioned applications are hereby incorporated by reference.

STATEMENT REGARDING FEDERALLY SPONSORED RESEARCH

The invention was made with support from Grant NSF-0425826 from the National Science Foundation Nanoscale Science and Engineering Center. The United States Government has certain rights in the invention.

FIELD OF THE INVENTION

The invention relates to nanotechnology. More specifically, the invention relates to a non-volatile bistable nanoswitch for an electrical circuit.

BACKGROUND OF THE INVENTION

Switching devices used in electronic components such as memory chips and microprocessors preferably provide high density, non-volatile storage at high speed, low power consumption, and low cost. The use of nanotechnology has promised improvements in all of these areas. For example, WO 01/03208 describes the use of single-walled carbon nanotubes (SWNT) in crossbar junctions as memory devices. In a nanoscale crossbar memory device, a nanowire such as a SWNT is suspended over other nanowires at a junction. An electrical current in one or both nanowires causes either attraction or repulsion of the wires, resulting in the stable closing or opening of an electrical circuit. However, such devices are considered difficult to produce reliably and to use commercially, because of the problems inherent in using directed growth or chemical assembly of the nanowires at the scale required. In other proposed nanoscale switching devices, such as described in U.S. Pat. No. 6,919,592, sheets of nanoelements such as SWNT are used as actuation elements. With such devices, the ratio of the voltage required to switch to one state is on the order of six-fold higher than the voltage required to switch to the other state, adding significant complexity to the operation of such devices. Thus, there remains a need to develop nanoscale switching devices that are simple to construct and to operate, and that provide high density, low power non-volatile storage.

SUMMARY OF THE INVENTION

The invention provides a non-volatile bistable nano-electromechanical switch employing one or more nanotubes such as SWNT as the actuation element. In this design the actuation of each of two different states, as further described below, can be achieved at about the same voltage, and at a relatively low voltage, compared to other SWNT electromechanical devices. The nanoswitch device of the current invention can be applied in the fabrication of latches, flip-flops, registers, and other components used, for example, in microprocessor chips for computers and other applications. A nanoswitch device according to the invention can also be incorporated with existing CMOS processes to fabricate non-volatile memory devices, and modifications to the bistable nanoswitch can result in sensor devices such as radiation detectors, chemical sensors, thermal sensors, and biological sensors.

One aspect of the invention is a non-volatile, bistable nanoswitch device. The device includes as the actuation element a single-walled carbon nanotube spanning a gap between first and second electrical terminals or contacts exposed on a surface of an insulating nanosubstrate. The gap between the terminals contains first and second nanoscale channels. The device further contains a third electrical terminal exposed on the surface of the nanosubstrate. The third terminal is electrically connected to a first conductive layer situated within the first channel. The device still further contains a fourth electrical terminal exposed on the surface of the nanosubstrate. The fourth terminal is electrically connected to a conductive layer situated within the second channel. When a first voltage is applied between the first and third terminals, the nanotube moves within the first channel and forms an electrical contact with the conductive layer in the first channel. This produces the activation of state 1, in which a non-volatile electrical connection is established between the first and third terminals. Moreover, application of a second voltage between the second and fourth terminals causes the nanotube to form an electrical contact with the conductive layer in the second channel. This activates state 2 by forming a non-volatile electrical connection between the second and fourth terminals. The design of the nanoswitch is such that activation of state 1 is accompanied by inactivation of state 2, and the activation of state 2 is accompanied by inactivation of state 1.

Another aspect of the invention is an electrical component that includes one or more nanoswitch devices as described above. In different embodiments, the electrical component is a latch, a flip-flop, a register, or a relay.

In another aspect, the invention provides a method of actuating a nanoswitch device as described above. The method includes the steps of: providing the nanoswitch device in state 1, having a non-volatile electrical connection between the first and third terminals; applying a voltage between the second and fourth terminals; and removing the voltage between the second and fourth terminals. The method establishes a non-volatile electrical connection between the second and fourth terminals, and abolishes the electrical connection between the first and third terminals.

Still another aspect of the invention is a method of actuating a nanoswitch device as described above. The method includes the steps of: providing the nanoswitch device in state 2, having a non-volatile electrical connection between the second and fourth terminals; applying a voltage between the first and third terminals; and removing the voltage between the first and third terminals. The method establishes a non-volatile electrical connection between the first and third terminals, and abolishes the electrical connection between the second and fourth terminals.

Yet another aspect of the invention is a method of making a non-volatile, bistable nanoswitch device. The method includes the steps of applying an insulating layer onto a substrate surface; applying a metal mask layer onto the insulating layer; applying a photoresist layer onto the metal mask layer; using lithography to fabricate in the photoresist, metal mask, and insulating layers first, second, third, and fourth nanoscale terminal areas and first and second nanoscale channels; applying a conductive layer onto the terminal areas, the channels, and the metal mask layer, whereby conductive terminals are formed in the terminal areas and conductive channels within the channels; removing the metal mask layer, leaving conductive layer inside the terminal areas and channels; and applying one or more actuation nanoelement across the insulating area and the first and second channels. The nanoelement provides electrical contact between the conductive layer of the first and second terminals. The terminals are situated around an insulating area containing the channels. The first and second terminals are generally situated opposite each other, and the third and fourth terminals are generally situated opposite each other. The third terminal is connected to the first channel and the fourth terminal is connected to the second channel. The nanoelement actuator lies over the channels, and is capable of movement that establishes electrical contact between the nanoelement and the conductive layer in the channel when voltage is applied between the conductive layer of a channel and a terminal not connected to the channel.

Still another aspect of the invention is a method of integrating a single nanowire, such as a SWNT, into a nanocircuit. The method includes the steps of: providing a nanosubstrate, a surface of which contains two conductive terminals separated by an insulating area; adding a liquid suspension of nanotubes, such as SWNT, to the surface of the nanosubstrate to cover the conductive terminals; performing dielectrophoresis by applying a voltage between the two conductive terminals; and removing excess SWNT using a stream of gas, such that only one SWNT remains in electrical contact with both conductive terminals.

DESCRIPTION OF THE DRAWINGS

Other features and advantages of the present invention will be apparent from the following detailed description of the invention, taken in conjunction with the accompanying drawings.

FIG. 1 shows schematic representations of a prior art nanoswitch device (FIG. 1A) and an embodiment of the present invention (FIG. 1B).

FIG. 2 shows a perspective view of a nanoswitch device embodiment in which a single nanotube serves as the actuation element.

FIG. 3 illustrates the non-volatility of two states (FIG. 3A, State 1; and FIG. 3B, State 2) in an embodiment of the nanoswitch device of the present invention, shown in cross section.

FIG. 8 shows the effect of performing dielectrophoretic assembly of SWNT actuators using an AC voltage without (FIG. 8A) or with (FIG. 8B) a phase shifter.

DETAILED DESCRIPTION OF THE INVENTION

Figure 4A:
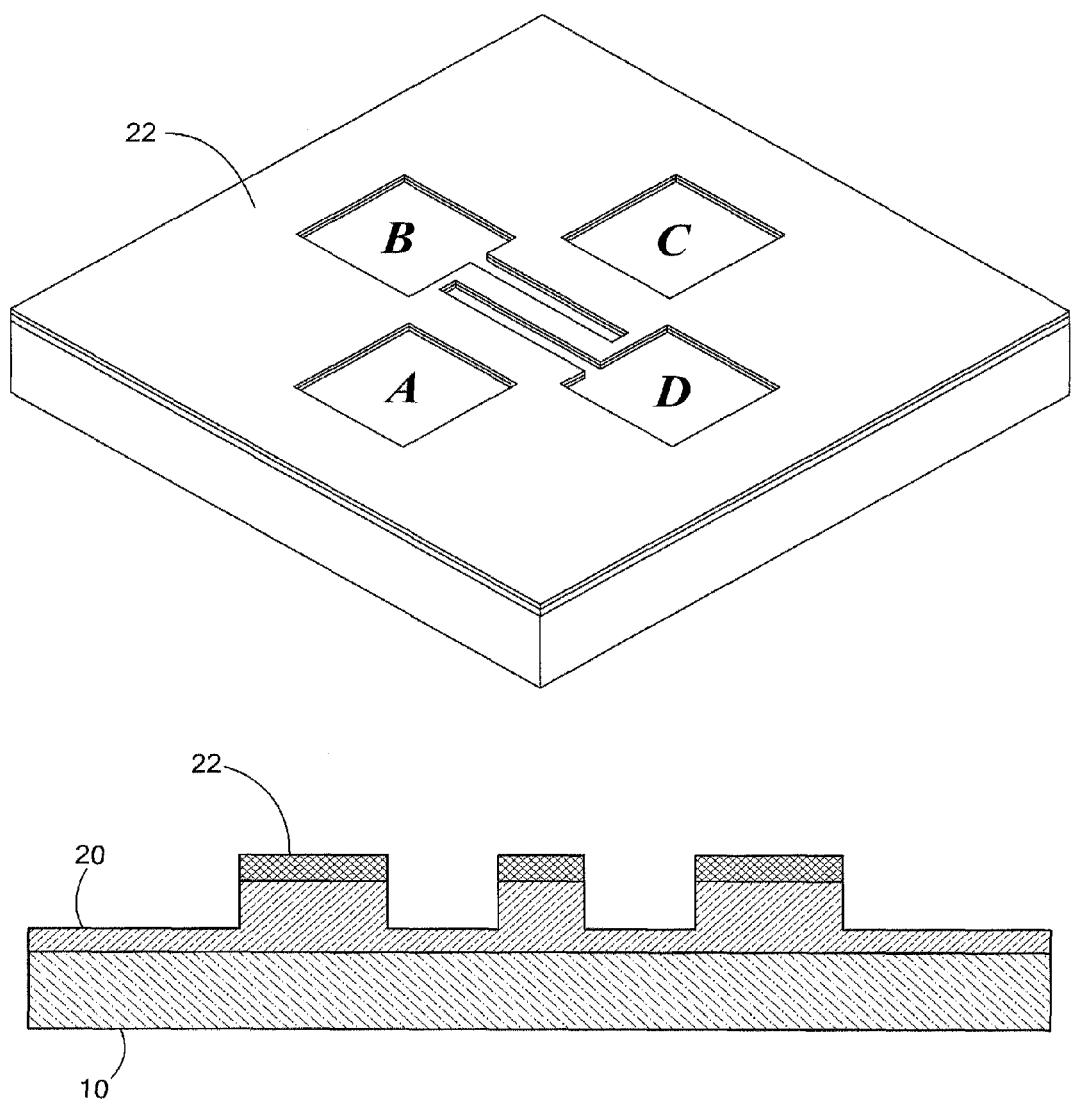
In FIG. 4A, the insulating layer and metal mask layer have been etched to prepare conductive terminals and channels. A conductive layer has been added in FIG. 4B. The unwanted portions of the conductive layer have been removed together with the metal mask layer in FIG. 4C. The actuation element, a single-walled carbon nanotube, has been added in FIG. 4D.

The inventors have developed a bistable nanoscale switching device capable of switching between two non-volatile states. The device utilizes a nanoelement such as a single SWNT as the actuator. A method for fabricating the nanoswitch has been developed in which one SWNT is attached by dielectrophoresis in a crossbar junction configuration that allows electromechanical forces to stably and repeatedly switch between two alternative electrical connections. The nanoswitch can be incorporated into circuits such as flip-flops, latches, registers, and relays, and will find application as an element of electrical components such as memory devices and microprocessors.

A comparison between a prior art nanoscale switch device and a device according to the present invention is shown in FIG. 1. The earlier device design shown in FIG. 1A requires a restoring electrode, whose fabrication requires additional steps. The configuration of a device according to the present invention (FIG. 1B) is simpler, resulting in lower production costs. Further, instead of the patterned sheets of nanoelements used in many previous devices, the nanoswitch of the present invention can use SWNT bundles or even a single SWNT as the actuation element. The result is that less power is consumed in response to the same voltage applied for switching between two alternative states. Also, the configuration of the present invention allows the same low voltage to be used to set either of two states, allowing a 5-fold reduction in voltage compared to prior devices. The dimensions of the device are in the nanometer range, and hence result in increased storage density compared to larger microscale devices.

Referring now to schematic diagrams of one embodiment of a bistable, non-volatile nanoswitch device of the present invention, a cross sectional view is shown FIG. 1B, and a top perspective view is shown in FIG. 2. Nanoswitch device 5 contains four metallic or conductive terminals A, B, C and D fabricated on a surface of an insulating substrate by well established nanofabrication and microfabrication methods. These terminals are also referred to herein as first terminal 80, second terminal 85, third terminal 90, and fourth terminal 95. The four terminals surround an insulating area on the surface of the substrate. The substrate contains base layer 10 for mechanical support beneath insulating layer 20. The exact positions of each of the terminals is not critical and can be determined according to the situation or user preference. However, the first and second terminals are generally positioned opposite each other, and the third and fourth terminals are generally situated opposite each other. In the embodiment depicted in FIGS. 1B and 2, the first and second terminals are positioned about 180 degrees from each other, and the third and fourth terminals are similarly positioned about 180 degrees from each other. In this embodiment, a line connecting the first and second terminals is approximately perpendicular to (at 90 degrees to) a line connecting the third and fourth terminals. This arrangement permits a crossbar junction to be formed, as outlined below. Third terminal 90 and fourth terminal 95 are extended to form trenches or channels in the insulating area between first terminal 80 and second terminal 85. More specifically, third terminal 90 is connected to first channel 40, and fourth terminal 95 is connected to second channel 42. As used herein, the first and second terminals (80 and 85) may also be referred to as "electrodes" while the first and second channels (40 and 42) may also be referred to as "extension electrodes". The two channels do not intersect, and do not connect with either first terminal 80 or second terminal 85. The four terminals and the two channels are lined with a layer of conductive material 30. The conductive layer of the terminals as well as the channels is preferably below the level of the insulator. SWNT 50 electrically connects first terminal 80 with second terminal 85, but in the open state does not have electrical contact with the conductive layer in either channel 40 or channel 42. The completely fabricated substrate 100 containing terminals 80, 85, 90, and 95 as well as channels 40 and 42 can be connected to a circuit, such as circuit 60 or circuit 70 as shown in FIG. 1B, to form functional nanoswitch device 5.

The geometry described above is easily scalable, such that many more pairs of electrodes (similar to 80 and 85) and trenches (similar to 40 and 42) can be fabricated, thereby increasing the number of switches.

Referring now to FIG. 3A, when a potential is applied between terminals B and C above a critical voltage $V_{cr}$ (also referred to herein as the "first threshold voltage"), due to field effects and the flexibility of the SWNT, the SWNT adheres to the extension electrode of terminal B and electrical continuity is established between terminals B and C. This is defined as state 1; a cross-sectional view of the state is shown in FIG. 3A. During state 1 there is no electrical continuity between terminals D and C. This critical voltage $V_{cr}$ is a function of the gap between the SWNT and the extension electrode, the width of the extension electrode, and the diameter of the SWNT. Even after the applied voltage between the terminal B and C has been has been turned off the SWNT remains connected due to intermolecular forces, until further switching is carried; hence state 1 is non-volatile.

Referring now to FIG. 3B, when a potential is applied between terminals D and A above the critical voltage $V_{cr}$ (also referred to herein as the "second threshold voltage"), the SWNT adheres to the extension electrode of terminal D, and electrical continuity is established between terminals D and A. In doing so, the axial tension of the SWNT increases enormously, and the SWNT overcomes the intermolecular forces responsible for SWNT attachment to the extension electrode of terminal B, thereby interrupting electrical continuity between terminals B and C. This is defined as state 2; a cross sectional view of this state is shown in FIG. 3B. When the potential applied between D and A is removed, the SWNT still adhere to the electrode extension of terminal D, thus maintaining state 2 until further switching is initiated. The critical voltage $V_{cr}$ is a function of the gap between the SWNT and the extension electrode, the width of the extension electrode, and the diameter of the SWNT.

Figure 4B:
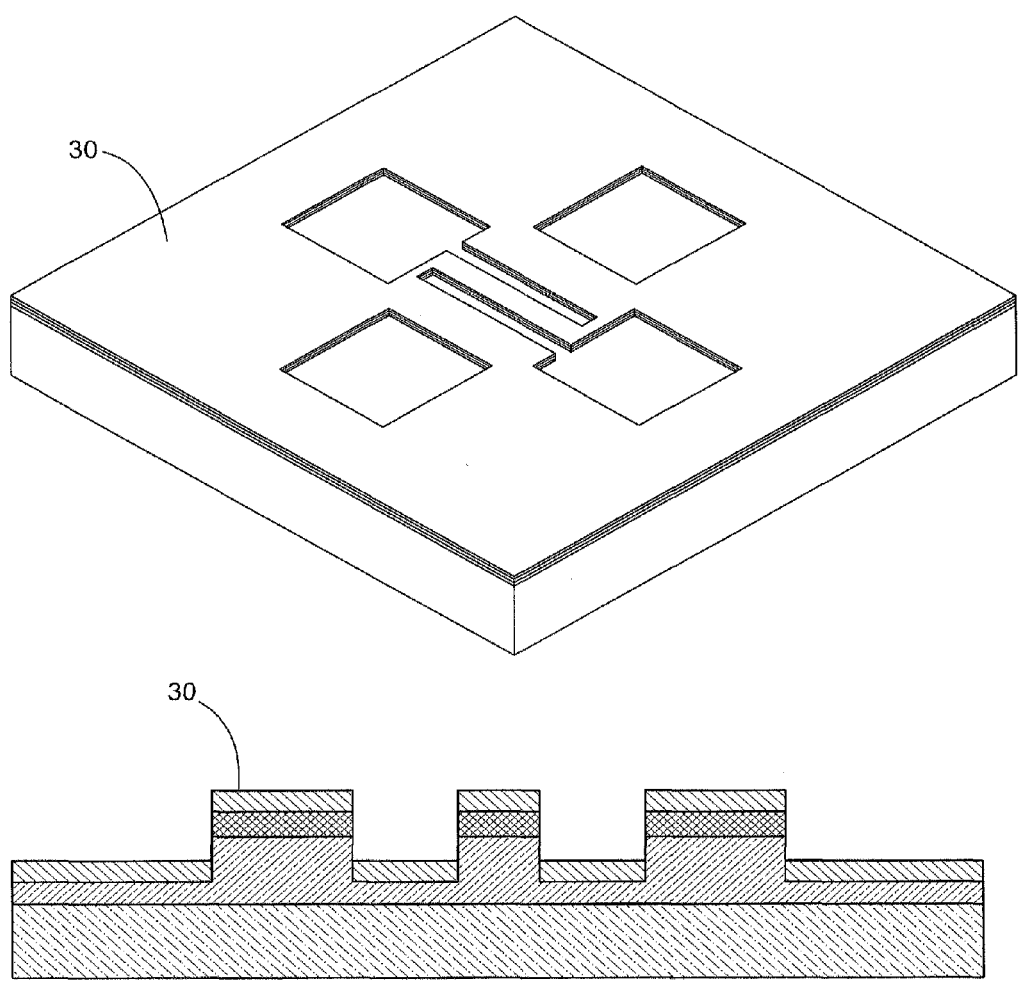
FIG. 4 shows an example of a process for making a nanoswitch device of the present invention.

One possible fabrication process is shown schematically in FIG. 4. A standard E-Beam lithography process (or a similar lithography process suitable for the nanometer scale, such as UV, immersion or EUV lithography) can be employed to expose the desired patterns onto a positive photoresist spun onto a metal deposited on an insulating substrate. After developing the photoresist, an anisotropic etching of the insulator is carried out, resulting in the structure depicted in FIG. 4A. Preferably, wet etching of the insulator is performed, e.g., by dipping the substrate in an etching solution. This ensures that an undercut is developed in the insulating trenches, so as to prevent metal deposition on the side walls. Metal deposition is carried out, resulting in the structure shown in FIG. 4B. Metal deposition is immediately followed by a lift off process to yield a structure as shown in FIG. 4C, which is now ready for the assembly of SWNTs, resulting in the completed nanoswitch shown in FIG. 4D.

Figure 5:
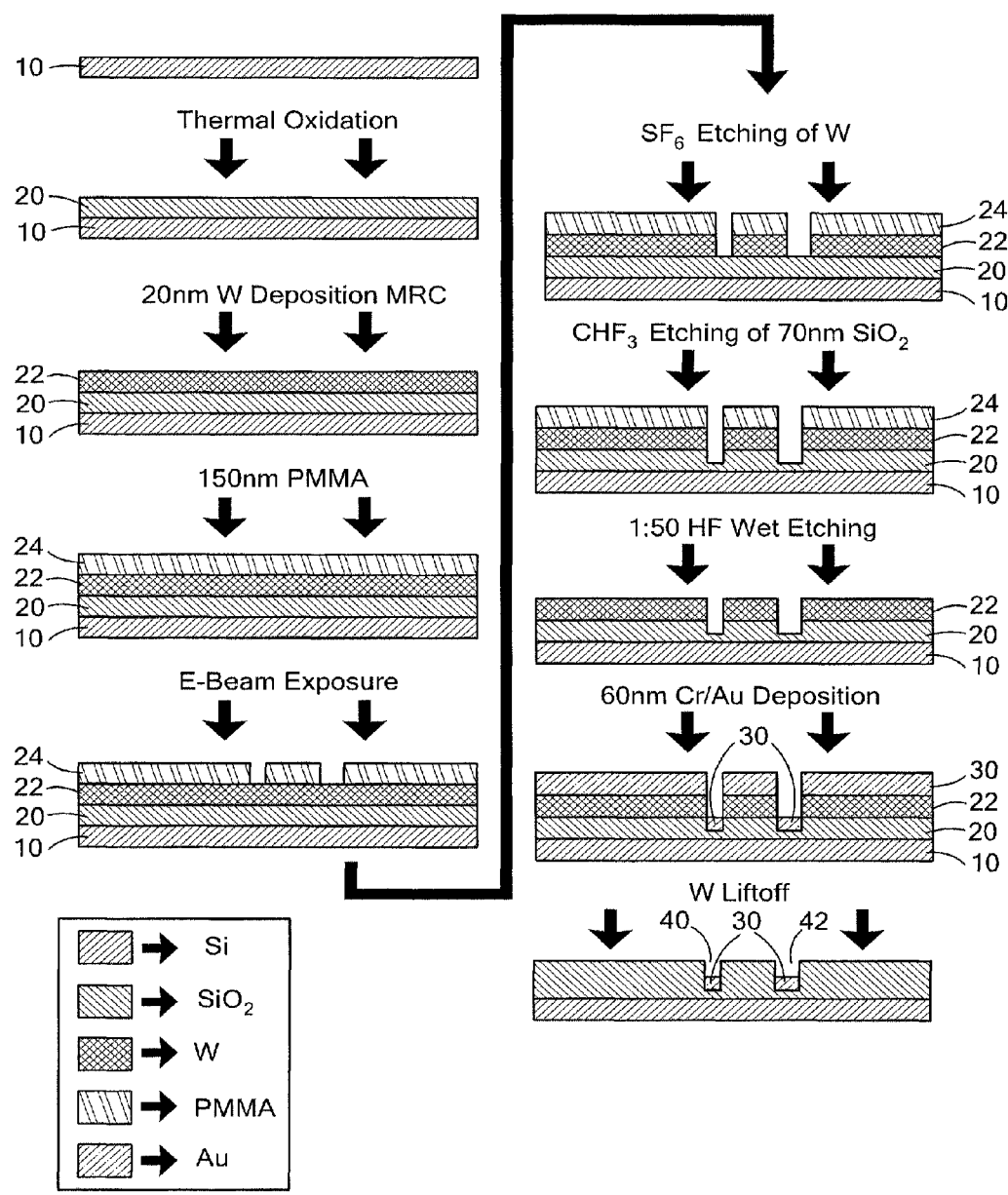
FIG. 5 shows an example of a process for making a nanoswitch device of the invention by adding sequential layers to a substrate, performing lithography, and etching.

FIG. 5 depicts a sample layering, lithography, and etching process used to build the etched substrate of a nanoswitch device according to the invention. Substrate layer 10 can be any material that provides mechanical support for the device and can be fabricated with standard techniques. The substrate is preferably a non-conducting (insulating) or semi-conducting material such as silicon, silicon dioxide, or silicon nitride. If the substrate itself is not sufficiently insulating, then insulating layer 20 can be added to the substrate, e.g., by thermal oxidation of silicon to form silicon dioxide. Preferably the insulating layer is at least 80 nm in thickness. The thickness of the insulating layer can be adjusted depending, for example, on the purity of the substrate material or the pattern of the trenches. The increased presence of impurities in, e.g., silicon used as the substrate base may be compensated by using a thicker insulating layer. The preferred thickness of the insulating layer also increases as the width of the trenches (first and second channels) increases. Suitable trench dimensions that maintain the non-volatile nature of the nanoswitch states can be determined, for example, by reference to FIG. 10A. Metal mask layer 22 is applied onto the insulating layer. For example, the metal mask layer can be a 20 nm thick layer of tungsten. Next, photoresist layer 24 is applied (e.g., spun on) to the mask layer. For example, the photoresist can be a 150 nm thick layer of polymethylmethacrylate (PMMA). Following application of the resist, the photoresist is exposed to provide the pattern of conducting material required to form the conductive terminals (electrodes) and channels (extension electrodes) of the device. For example, exposure can be by standard electron beam lithography. After exposure of the resist, the metal mask layer is etched. For example, a tungsten mask layer can be etched using $SF_6$. The insulating layer is then etched. For example, $CHF_3$ can be used to etch a silicon dioxide insulating layer to a depth of about 70 nm. An additional wet etching step (e.g., using a 1:50 dilution of 30% HF) is preferred, so as to undercut the channel regions, which will inhibit metal deposition on the side walls; such metal deposition could defeat the actuation mechanism. The preferred etch rate is about 4 nm/min. Finally, the conductive layer is applied, and subsequently the mask is lifted off. Any metallic conductor can be used for the conductive layer. For example, gold, silver, chromium, or any combination thereof can be used. A preferred conducting layer is a 60 nm layer of Cr/Au. Preferably, the conductive layer remains slightly below the surface of the adjacent insulating layer at the terminals (electrodes), and well below the insulating layer surface adjacent to the channels (troughs).

According to the invention, assembly of one or more nanoelements such as SWNTs between the electrodes, for use as the actuator of the nanoswitch, is performed using dielectrophoresis. In a dielectrophoresis (DEP) process, it is well known that the dielectrophoretic force is determined by the electrical properties of the medium and the object, the object size and shape, the geometry of the electrodes, and the frequency of the electric field. The DEP force can be written as $$F_{DEP} = \frac{\pi}{6} r^2 l \varepsilon_m \text{Re}\{K(\omega)\} \nabla E_{rms}^2$$

$$K(\omega) = \left(\frac{\varepsilon_p^* - \varepsilon_m^*}{\varepsilon_m^*}\right)$$

Where l and r are the length and radius of a rod-like particle, $\epsilon_m$ is the real permittivity of the suspending medium, $E_{rms}$ is the root mean square (rms) of the electric field, and $K(\omega)$, is the Clausius-Mosotti factor. $\epsilon_p^*$ and $\epsilon_m^*$ are the complex permittivity of the rod-like particle and the suspending medium, respectively. $\epsilon^* = \epsilon - i(\sigma/\omega)$, where $i = \sqrt{-1}$, $\epsilon$ is the real permittivity and $\sigma$ is the conductivity of the material. E is a material property and can be written as a product of the relative permittivity of the material and permittivity of free space $\epsilon_0$.

In order to assemble one or more carbon nanotubes at actuator element of the nanoswitch by dielectrophoresis, the application of an AC voltage source with a frequency in the range from about 100 kHz to about 10 MHz is preferred. A frequency of about 1 MHz is more preferred. The amplitude of the AC voltage can be in the range from about 1 to about 5 volts. Preferably, a phase shifter is used to provide voltage gradients of opposite direction at the two electrodes during dielectrophoresis. Some adjustment of the voltage source conditions may be required depending on batch-to-batch differences in commercially supplied nanotubes.

The nanoelement or nanoelements used as the actuation mechanism for the nanoswitch are preferably either SWNT or multi-walled carbon nanotubes. The nanotube or nanotubes can be configured either as a bundle containing a small number of nanotubes, e.g., 1 or more, or about 1-10, 2-10, 3-10, or 5-10 nanotubes, or as a single nanotube spanning the first and second terminals of the nanoswitch device. Single nanotubes are most preferred as the actuator. SWNT can be obtained from commercial sources as an aqueous suspension. For the studies described in the Examples, SWNT were obtained either from Nantero, Inc. (Woburn, Mass.) or from Brewer Science, Inc. (Rolla, Mo.). The SWNT suspensions generally had a pH value in the range of 6-7 and a conductivity in the range from about 10 to about 40 μS/cm, or about 30 μS/cm. While individual nanotubes are preferred as the actuator, if a greater number of nanotubes is desired, then either the concentration of the nanotube suspension can be increased, or the time of dielectrophoresis can be increased.

The method of integrating a single nanowire, such as a SWNT or a multi-walled carbon nanotube, into the nanoswitch device of the present invention also can be used to integrate such a nanowire into a nanocircuit, for example, a circuit or device that does not function as a switch but performs another function. A nanosubstrate for incorporation of the nanowire has a surface that contains at least two exposed conductive terminals separated by an insulating area. A liquid suspension of nanotubes, such as SWNT, is added to the surface of the nanosubstrate to cover the conductive terminals and a portion or all of the insulating area between them. Dielectrophoresis is then performed by applying a voltage between the two terminals, for example, by using the terminals as electrodes for dielectrophoresis. Conditions for dielectrophoresis are similar to or the same as those for assembling a SWNT in the nanoswitch of the present invention. Following dielectrophoresis, excess SWNT suspension can be removed using a stream of gas (e.g., nitrogen), such that only one SWNT remains in electrical contact with both conductive terminals.

A nanoswitch device according to the invention is preferably non-volatile and bistable, i.e., existing in one of two stable switching states for a long period of time (e.g., for at least an hour, a day, a week, a month, a year, or longer) until a signal is sent to the device to switch it into the other state. In order to serve as a switch, in a preferred embodiment each state is characterized by possessing a conductance pathway between certain conductive terminals, but leaving an open circuit between others. For example, a method of switching from state 1 to state 2 can include the steps of: (1) providing a bistable, non-volatile nanoswitch device in state 1, having a non-volatile electrical connection between first and third terminals; (2) applying a voltage between second and fourth terminals; and (3) removing the voltage between the second and fourth terminals. The method establishes a non-volatile electrical connection between the second and fourth terminals, and abolishes the electrical connection between the first and third terminals. A related method of switching from state 2 to state 1 can include the steps of: (1) providing a bistable, non-volatile nanoswitch device in state 2, having a non-volatile electrical connection between second and fourth terminals; (2) applying a voltage between first and third terminals; and (3) removing the voltage between the first and third terminals. The method establishes a non-volatile electrical connection between the first and third terminals, and abolishes the electrical connection between the second and fourth terminals.

An advantage of the present nanoswitch is that approximately the same low voltage will suffice to both switch the device from state 2 to state 1 (first voltage) and to switch it from state 1 to state 2 (second voltage). The required voltage will depend on the particular design, but a switching voltage in the range of about 3 volts is preferred. Any voltage above the threshold required for switching can be used, but excessive voltage that could damage the device should be avoided.

The following examples are presented to illustrate the advantages of the present invention and to assist one of ordinary skill in making and using the invention. These examples are not intended in any way otherwise to limit the scope of the disclosure.

EXAMPLES

Example I

Dielectrophoretic Assembly of SWNT Actuation Element

The assembly of SWNT from solution to form an actuation structure in a nanoswitch device was carried out using a dielectrophoretic assembly process. The process is illustrated schematically in FIG. 6.

Figure 6:
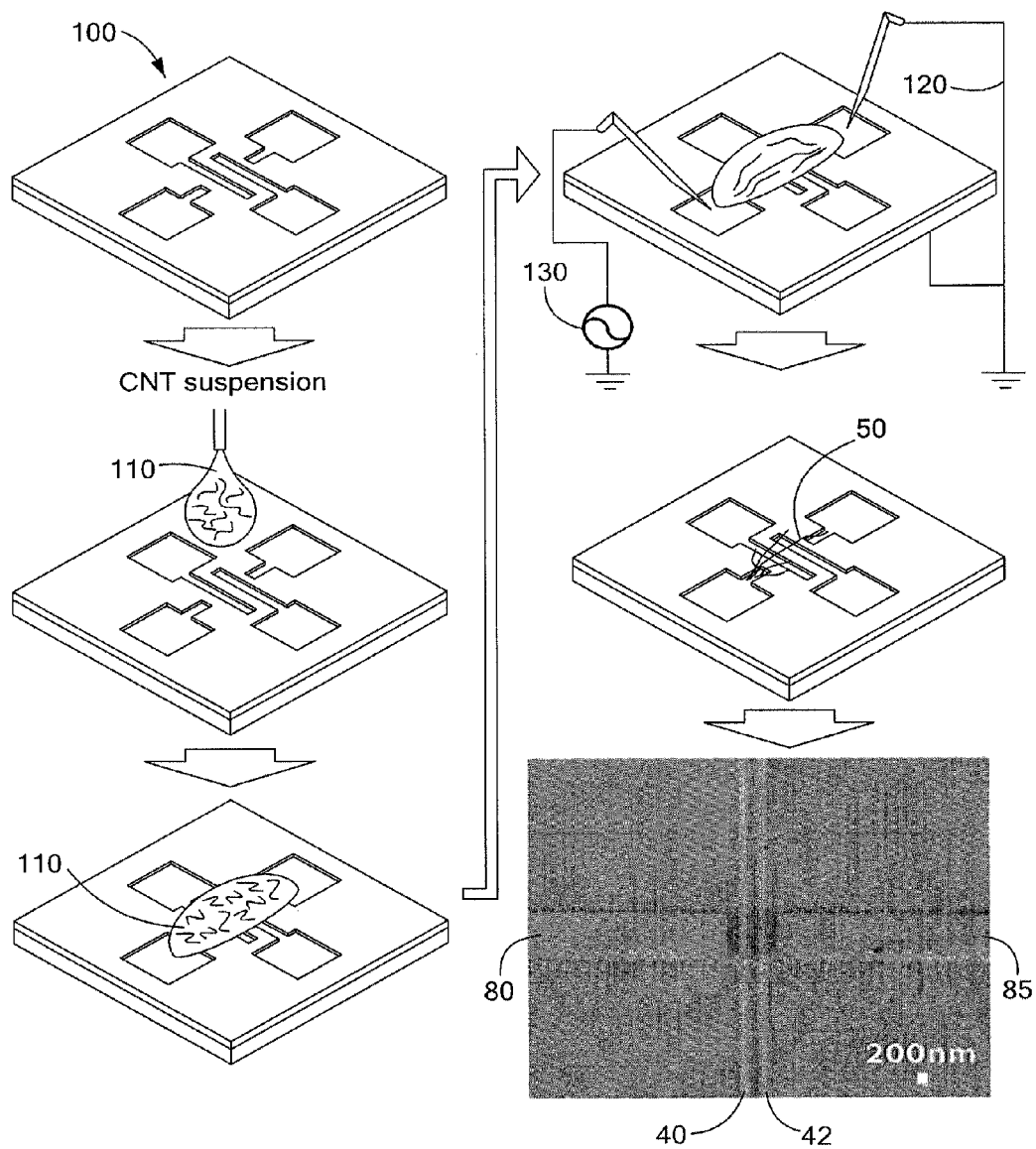
FIG. 6 illustrates the steps of a process for adding a single-walled nanotube as actuation element to a nanoswitch device.

An aqueous suspension of commercially available highly purified SWNTs was used in the experiment. The aqueous suspension was diluted to $10^{-5}$ g/ml using deionized water, and 1 μL of SWNT suspension 110 was deposited onto the surface of etched, metal-coated substrate 100 so as to bridge and cover the insulating area between the first and second electrodes and containing the extension electrodes. The substrate was configured for dielectrophoresis as shown in FIG. 6 (120) by attaching leads to the first and second electrodes, and attaching the electrodes to AC voltage source 130. Assembly was conducted at a frequency of 1 MHz with the AC voltage between two electrodes in the range from 1 to 5 Vpp. After 1 min of assembly, the solution was dried using a stream of nitrogen gas.

Example II

Optimization of Electrode Configuration

Figure 7:
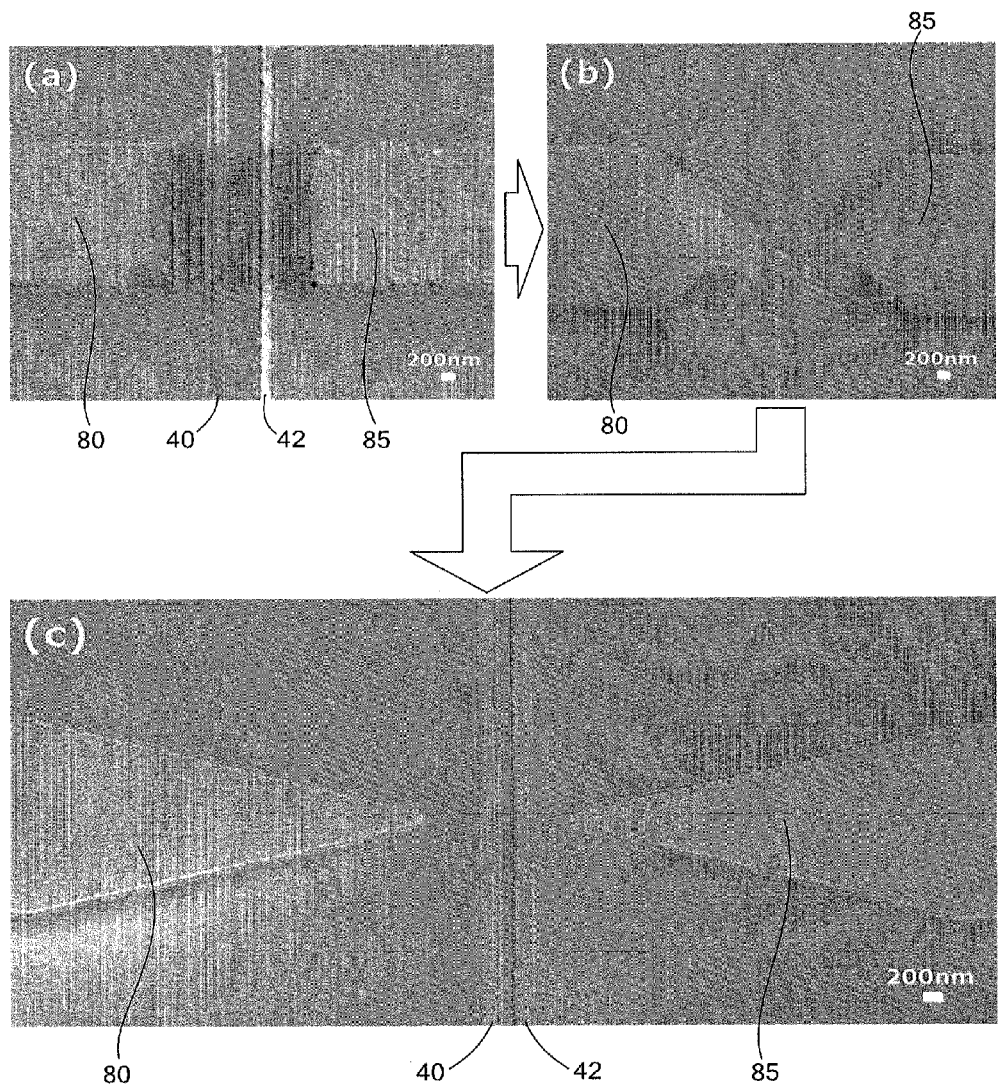
FIG. 7 shows a series of blunt (FIG. 7A), intermediate (FIG. 7B), and fine-tipped (FIG. 7C) electrodes for use in the dielectrophoretic assembly of a SWNT actuation element.

In the experiment shown in Example I, the resulting nanotubes were difficult to align appropriately and reproducibly by varying process parameters including pH, SWNT concentration, conductivity of the solution, AC voltage, and frequency of the applied field. Therefore, the dielectrophoretic process was modified to achieve better assembly. Specifically, modifications were directed to the electric field gradient, represented as $\nabla E_{rms}^2$, in dielectrophoresis equations. It was discovered that a change of the electrode configuration was necessary to get the desired electrical field gradient. Dielectrophoresis was carried out using the same conditions as in Example I. In the case of flat electrodes, shown in FIG. 7A, a number of SWNTs were assembled over a large area between the two electrodes, because flat electrodes provide a uniform electric field over a large area. Electrodes with a triangular shape at their tips also were fabricated (FIG. 7B), and again used to assemble SWNT using the same conditions as before. However, there were too many SWNTs assembled between two edge points as well as SWNT assembled at the angular point. Finally, very sharp electrodes were designed as shown in FIG. 7C and used to carry out the assembly of SWNTs using the same conditions. Using the sharp electrodes, the nanotubes assembled only between the tips, and did not form between two edge points, because the strength of electric field was reduced by the long distance between the edges.

Example III

Use of Phase Shifting to Assemble SWNT Actuator

Using the sharp-tipped electrode configuration shown in FIG. 7C, as described in Example II, the SWNTs were sometimes assembled on only one electrode. This could be explained by the fact that no electric field gradient existed on the ground electrode. Therefore, a phase shifter was introduced to produce a field gradient at the ground electrode with opposite phase to that of the phase electrode. This is depicted schematically in FIG. 8, where the phase electrode is represented as electrode-A and the ground electrode as electrode-B. FIG. 8 also presents scanning electron microscopy (SEM) images of SWNTs assembled without (FIG. 8A) or with (FIG. 8B) the use of phase shifting. The use of the phase shifter led to uniform SWNT assembly at both electrodes.

Example IV

Assembly of a Single-Stranded SWNT Actuator

Figure 9A:
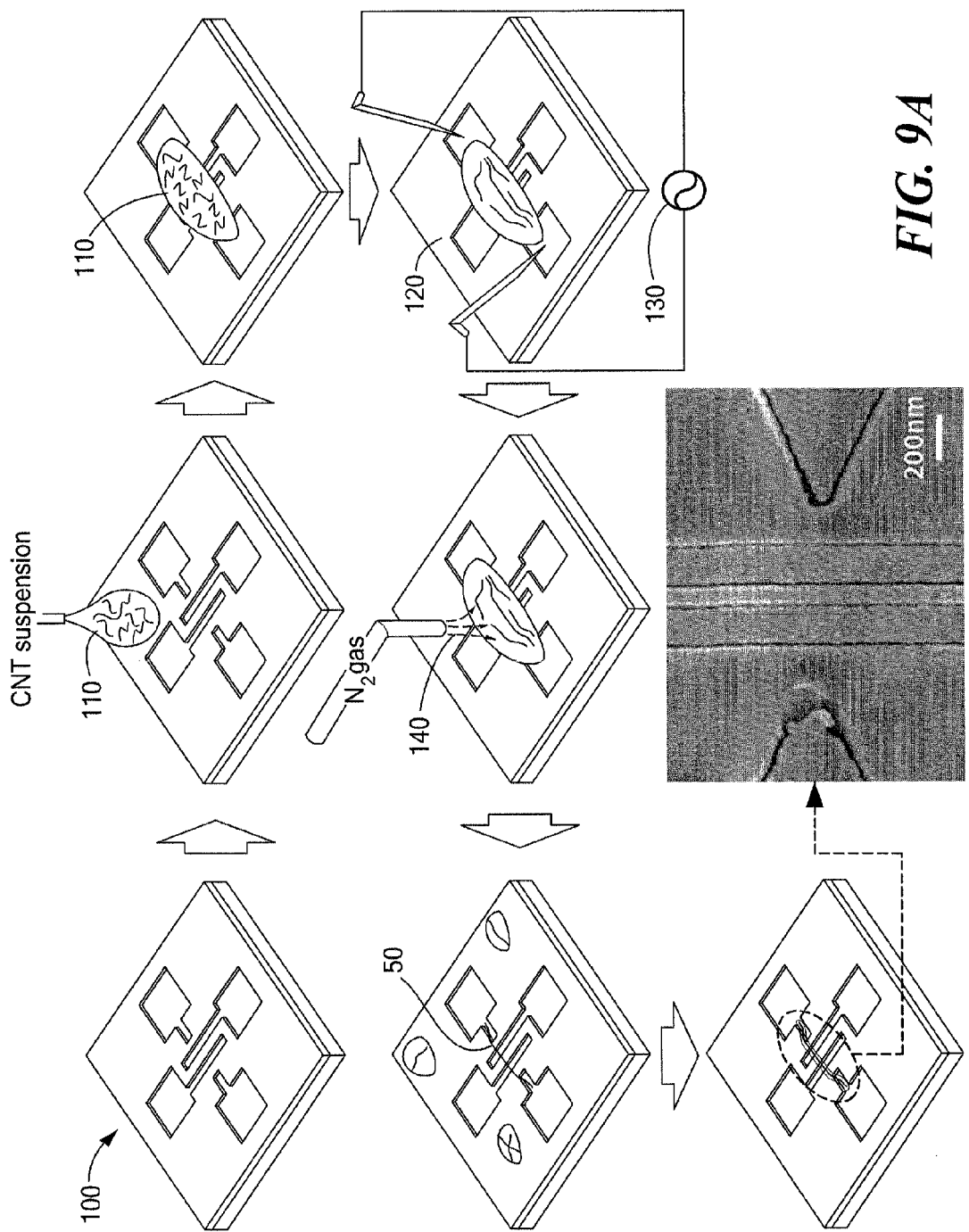
FIG. 9A shows a method for fabricating a bistable nanoswitch device having only one SWNT as actuator.
Figure 9B:
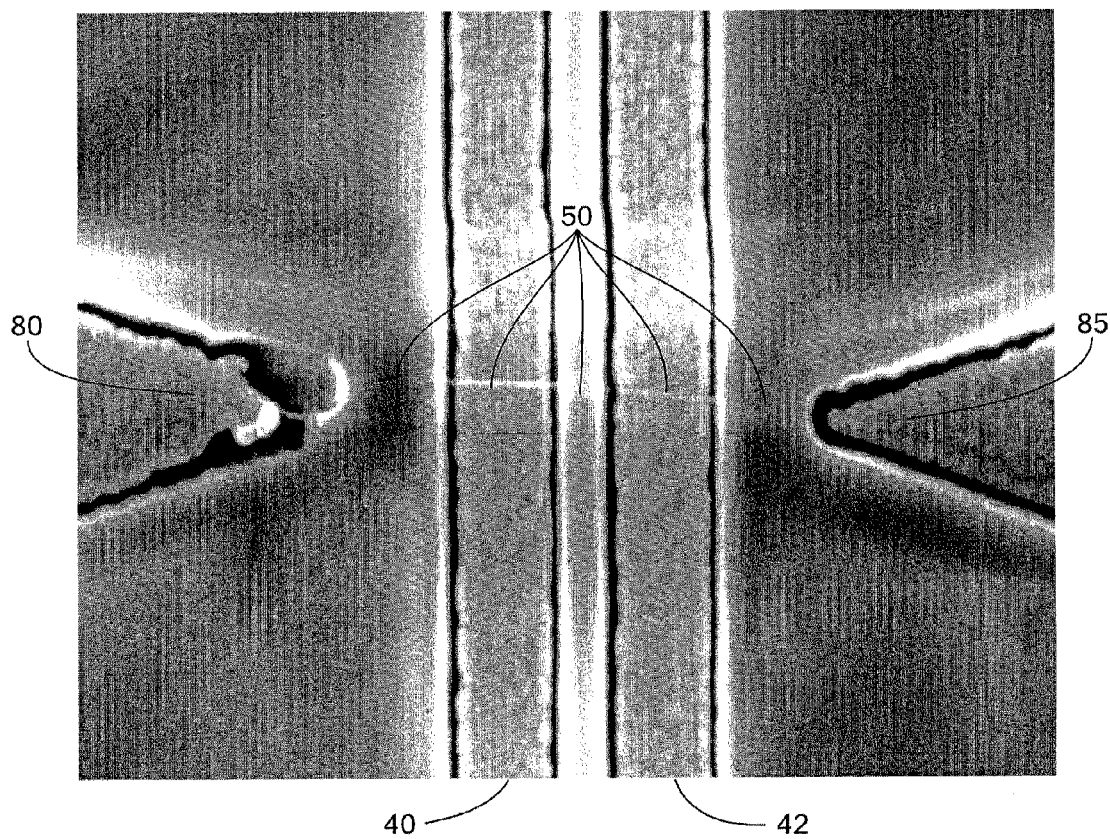
FIG. 9B is an enlargement of the micrograph of FIG. 9A.

Using the optimized dielectrophoresis conditions described in Examples I-III above (e.g., dielectrophoresis conditions of Example I, sharp electrodes of FIG. 7C, use of phase shifting as in FIG. 8B), studies were undertaken in order to achieve one single strand of SWNT assembled per device on the template. When the SWNT suspension was allowed to dry in ambient air following assembly by dielectrophoresis, invariably water marks remained. These indicated that some residual SWNTs remained, which could result in a reduction of the yield of the device through the presence of circuiting SWNTs in undesired positions. Hence an external stream jet line of nitrogen gas was introduced to dry the solution very efficiently, such that only one strand of SWNT is assembled. Nitrogen at 15 psi was blown over the SWNT suspension droplet from a height of 1 mm for 20 seconds. The process is depicted schematically in FIG. 9. Controlled assembly was effectively achieved with a high yield (about 80-95% of devices having one SWNT as the actuator). An SEM micrograph of a typical final nanoswitch device possessing a single-stranded SWNT actuator is shown in FIG. 9.

Example V

Operational Characteristics of a Single-Stranded SWNT Actuator

Figure 10A:
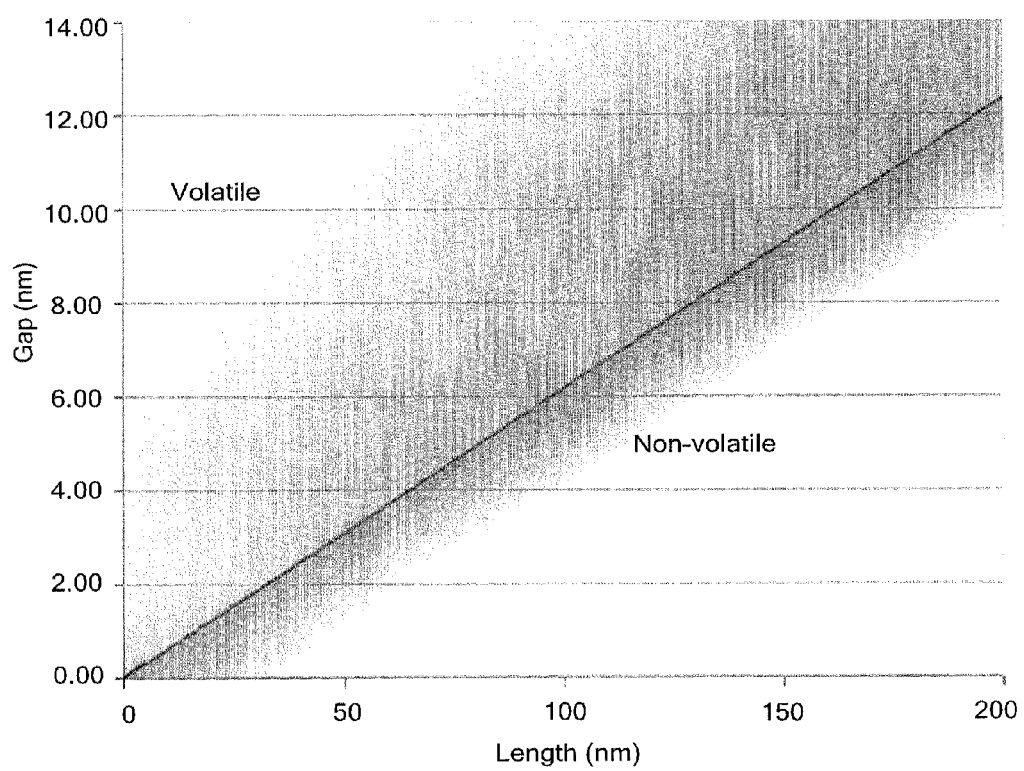
FIG. 10A shows a theoretical phase diagram of the volatility of the bridge structure as a function of the gap between the electrode and the carbon nanotube and the width of the electrode.
Figure 10B:
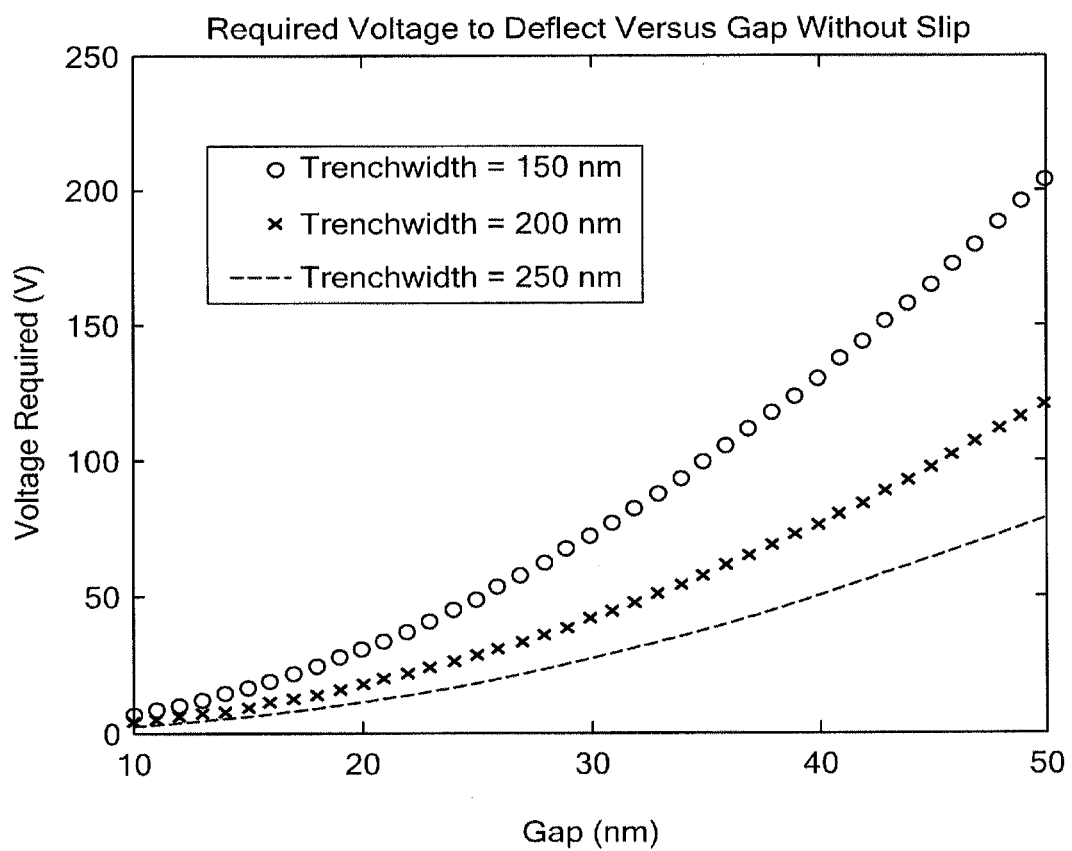
FIG. 10B shows the calculated upper limit of the actuation voltage as a function of the width and gap of the channel.

A non-linear model was employed to determine the mechanical and electrical limits for various device dimensions. Using the model, a phase diagram of the volatility of the bridge structure as a function of the gap between the electrode and the carbon nanotube and the width of the electrode was produced. The phase diagram is shown in FIG. 10A. The upper limit of the actuation voltage is shown in FIG. 10B as a function of the width and gap of the trench. Slippage of the SWNT at the SWNT-electrode interface was not considered.

While the present invention has been described in conjunction with a preferred embodiment, one of ordinary skill in the art, after reading the foregoing specification, will be able to effect various changes, substitutions of equivalents and other alterations to the compositions and articles set forth herein. It is therefore intended that the protection granted by Letter Patent hereon be limited only by the definitions contained in the appended claims and equivalents thereof.

What is claimed is:

1. A method of integrating a single nanowire into a nanocircuit, the method comprising the steps of:
    providing a nanosubstrate, a surface of the nanosubstrate comprising two conductive terminals separated by an insulating area;
    adding a liquid suspension of nanotubes to the surface of the nanosubstrate to cover the conductive terminals;
    performing dielectrophoresis by applying a voltage between the first and second conductive terminals; and
    removing excess nanotubes using a stream of gas, whereby only one nanotube remains in electrical contact with both conductive terminals.

2. The method of claim 1, wherein the step of performing dielectrophoresis comprises applying an AC voltage in the range from about 1 to about 5 volts.

3. The method of claim 2, wherein the AC voltage has a frequency of about 1 MHz.

4. The method of claim 1, wherein dielectrophoresis is performed using a phase shifter to provide an electrical field gradient at the ground electrode of opposite phase to that at the phase electrode.

5. The method of claim 1, further comprising iteratively performing the method while adjusting the concentration of nanotubes in the liquid suspension to identify a concentration at which only one nanotube is attached to both conductive terminals.

6. The method of claim 1, further comprising iteratively performing the method while adjusting the duration of performing dielectrophoresis to identify a duration at which only one nanotube is attached to both conductive terminals.

7. The method of claim 1, wherein the liquid suspension comprises single-walled carbon nanotubes (SWNT) and the integrated single nanowire is an SWNT, or the liquid suspension comprises multi-walled carbon nanotubes (MWNT) and the integrated single nanowire is an MWNT.

8. The method of claim 1, wherein each of the first and second conductive terminals comprises a pointed tip and the terminals are oriented with the tips pointing towards each other.

9. The method of claim 8, wherein each tip has a profile which forms an acute angle of about 30 degrees or less.

10. The method of claim 1, wherein the nanosubstrate comprises plural pairs of conductive terminals, each pair separated by an insulating area, and a single nanowire is integrated into said nanocircuit at each pair of conductive terminals such that each integrated nanowire is in electrical contact with a pair of conductive terminals.

11. The method of claim 1, wherein the insulating area forms an insulating gap separating the conductive terminals, the gap being about 800 nm in length.

12. The method of claim 1, wherein the conductive terminals comprise a material selected from gold, chromium, silver, and combinations thereof.

13. The method of claim 1, wherein the insulating area comprises a material selected from silicon, silicon dioxide, and silicon nitride.

14. The method of claim 1, wherein the stream of gas comprises nitrogen.

15. The method of claim 1, wherein the stream of gas is pressurized at 15 psi, and the stream is blown over the liquid suspension on the surface of the nanosubstrate from a height of about 1 mm above the nanosubstrate for a duration of about 20 seconds.

\* \* \* \* \*